(12) United States Patent
Suzuki et al.

(10) Patent No.: US 7,292,053 B2
(45) Date of Patent: Nov. 6, 2007

(54) HIGH-VOLTAGE MEASURING DEVICE

(75) Inventors: Koji Suzuki, Kakuda (JP); Kenichi Takebayashi, Kakuda (JP); Seiichiro Abe, Kakuda (JP); Takeshi Chiba, Kakuda (JP); Tomoya Katanoda, Ebina (JP)

(73) Assignee: Keihin Corporation, Tokyo (JP)

( * ) Notice: Subject to any disclaimer, the term of this patent is extended or adjusted under 35 U.S.C. 154(b) by 0 days.

(21) Appl. No.: 11/503,926

(22) Filed: Aug. 15, 2006

(65) Prior Publication Data
US 2007/0040544 A1 Feb. 22, 2007

(30) Foreign Application Priority Data
Aug. 22, 2005 (JP) .............................. 2005-239854

(51) Int. Cl.
- G01R 27/08 (2006.01)
- G01R 31/02 (2006.01)
- G01R 19/00 (2006.01)

(52) U.S. Cl. .................. 324/713; 324/72.5; 702/64
(58) Field of Classification Search ................ 324/713, 324/691, 649, 600, 522, 72.5; 702/64
See application file for complete search history.

(56) References Cited

U.S. PATENT DOCUMENTS

| | | | | |
|---|---|---|---|---|
| 4,870,343 A | * | 9/1989 | Dooley et al. .............. 324/72.5 |
| 5,136,234 A | * | 8/1992 | Shaw ........................... 324/72 |
| 5,136,237 A | * | 8/1992 | Smith et al. ................ 324/149 |
| 5,291,124 A | * | 3/1994 | Hoffman et al. ........... 324/72.5 |
| 5,898,324 A | * | 4/1999 | Yanagisawa ................. 327/81 |
| 6,385,547 B1 | * | 5/2002 | Bogli .......................... 702/64 |
| 6,490,143 B1 | * | 12/2002 | Estrela et al. ............... 361/113 |
| 6,674,290 B2 | * | 1/2004 | Wang ......................... 324/511 |
| 6,876,188 B2 | * | 4/2005 | Bohnert et al. ............... 324/96 |

* cited by examiner

Primary Examiner—Anjan Deb
Assistant Examiner—Hoai-An D. Nguyen
(74) Attorney, Agent, or Firm—Westerman, Hattori, Daniels & Adrian, LLP.

(57) ABSTRACT

The present invention provides a high-voltage measuring device capable of providing sufficient electric isolation between resistors and between resistors and a voltage measurement circuit without necessity of enlarging a size of a substrate for carry thereon the circuit. A high-voltage measuring device mounted on a substrate, including a high-voltage input terminal pair, a measuring terminal pair, a voltage measuring circuit having input terminals connected to the measuring terminal pair, and two resistive parts. One of the resistive parts electrically connects one of high-voltage input terminal pair and one of measuring terminal pair. The other of resistive parts electrically connects between the other of high-voltage input terminal pair and the other of measuring terminal pair. Each of the resistive parts includes a series circuit of at least one high resistance resistor and at least one low resistance resistor, and a distance between the high resistance resistors in each of the resistive parts is larger than that between the low resistance resistors.

2 Claims, 2 Drawing Sheets

HIGH-VOLTAGE MEASURING DEVICE

BACKGROUND OF THE INVENTION

1. Field of the Invention

The present invention relates to a high-voltage measuring device for detecting a high-voltage.

2. Description of the Related Art

On an accumulator such as a storage battery in an electronic car, a high-voltage measuring device for detecting a high-voltage is provided to protect against the electric overcharge or over-discharge.

As shown in FIG. 1, a conventional high-voltage measuring device is, for example, provided with two resistors 3 and 4 and a voltage measuring circuit 4 which are mounted on a substrate 1, for example, in the form of a printed circuit. Positive and negative terminals of a high-voltage battery 5 are electrically connected to one ends of the resistors 2 and 3, respectively. The other ends of the resistors 2 and 3 are electrically connected to input terminals of the voltage measuring circuit 4, respectively. The resistors 2 and 3 are used for dividing a high-voltage supplied from the high-voltage battery 5, and the voltage measuring circuit detects an electric potential difference between the resistors 2 and 3 which corresponds to the high-voltage.

It is to be understood that large-sized resistors have been used for the resistors 2 and 3 in the conventional device. Those resistors must have high resistances and high-voltage-proof properties since they are used into division voltage.

In addition, there arises another problem of high cost that the size of the substrate 1 must be large enough to make sure that the resistances 2 and 3 and the voltage measuring device 4 are separated from each other for electric isolation even under such high electric potential differences between the resistors and between the resistors and the voltage measuring device.

SUMMARY OF THE INVENTION

It is an object of the present invention to provide a high-voltage measuring device capable of providing sufficient electric isolation between resistors and between resistors and a voltage measurement circuit without necessity of enlarging a size of a substrate on which the circuit is to be mounted.

According to an aspect of the present invention, there is provided a high-voltage measuring device mounted on a substrate, comprising a pair of high-voltage input terminals, a pair of measuring terminals, a voltage measuring circuit having a pair of input terminals thereof connected to said pair of measuring terminals, two resistive parts, one of which electrically connects between one of the high-voltage input terminals and one of the measuring terminals and the other of which electrically connects between the other of the high-voltage input terminals and the other of the measuring terminals. Each of the resistive parts has a series circuit of at least one high resistance resistor and at least one low resistance resistor, wherein a distance between the high resistance resistors is larger than that between the low resistance resistors.

The above-mentioned configuration in which each of the resistive parts has a series circuit of at least one high resistance resistor and at least low resistance resistor results in that the high resistance resistors and low resistance resistors are reduced in size as compared to those in the prior art, and in that an applied voltage excluding a voltage across the voltage measuring circuit is distributed to the high and low resistance resistors in each of the resistive parts. When the high and low resistance resistors are reduced in size, distances between the high resistance resistors, between the low resistance resistors, and between each of the resistors and the voltage measuring device can be reduced more than the conventional device, whereby, the size of the substrate can be reduced.

DETAILED DESCRIPTION OF THE INVENTION

An embodiment of the present invention will be described in detail while referring to the accompanying drawings.

Figure 2:
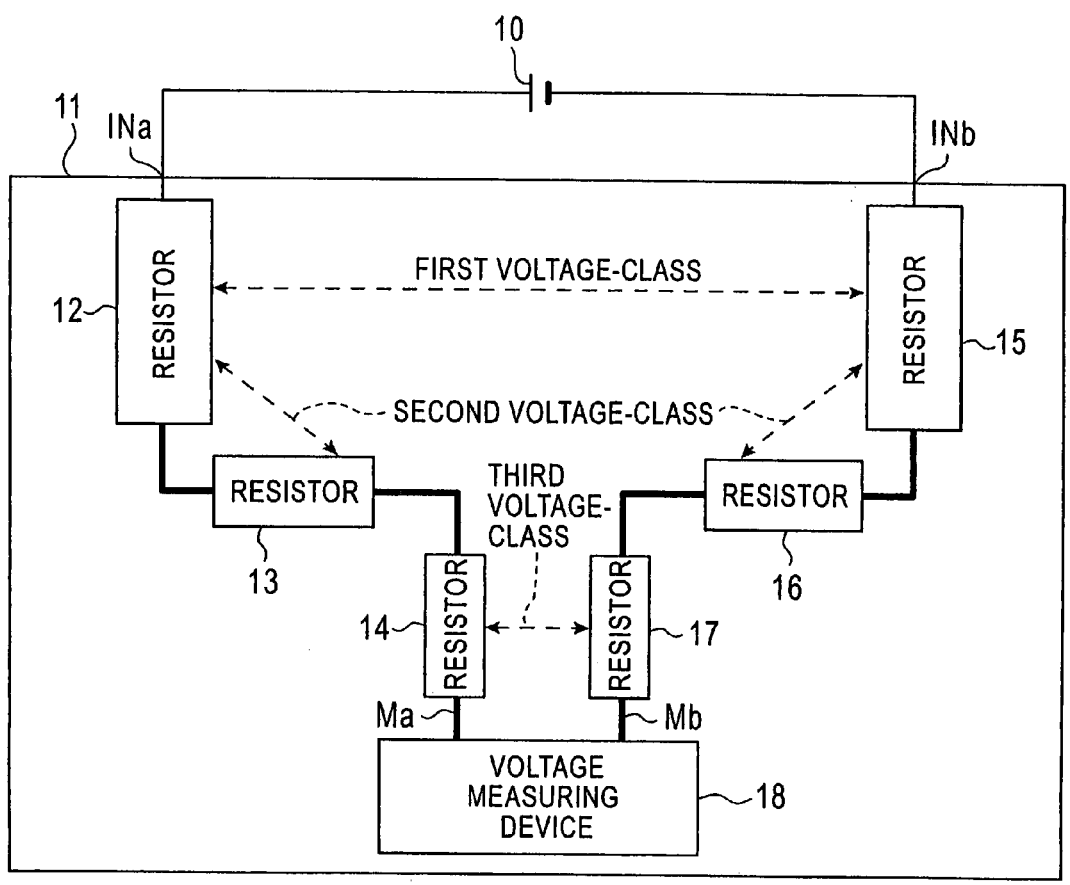
FIG. 2 illustrates a circuit diagram showing a high-voltage measuring device according to the present invention.

FIG. 2 shows a high-voltage measuring device according to the present invention. This measuring devices is mounted on a substrate land includes resistors 12-17 and a voltage measuring circuit 18. The resistors 12 and 15 have the same resistance of A Ω as each other. The resistors 13 and 16 have the same resistance of B Ω as each other. The resistors 14 and 17 have the same resistance of C Ω as each other. There are such relations among the resistances that the resistance A is greater in size than the resistance B and the resistance B is greater than the resistance C. There are also such relations among the size of the resistors in appearance that the resistors 12, 15 are greater in size than the resistor 13 and the resistor 16 is greater in size than the resistors 14, 17. The resistors 12, 13, and 14 form one resistor part and the resistors 15, 16, and 17 form another resistive parts.

On a substrate 11, the resistors 12, 13, and 14 are electrically connected in series in sequence and the resistors 15, 16, and 17 are electrically connected in series in sequence. One end of the series resistor circuit comprising the resistor 12, 13, and 14 and one end of the series resistor circuit of the resistor 15, 16, and 17 are electrically connected to a pair of high-voltage input terminals INa and INb formed on the substrate, respectively. The other ends of the series resistor circuit of the resistor 12, 13, and 14 and another end of the series resistor circuit of the resistor 15, 16, and 17 are electrically connected to a pair of measuring terminals Ma and Mb formed on the substrate 11, respectively.

The series resistor circuit of the resistor 12, 13, and 14 and the series resistor circuit of the resistor 15, 16, and 17 are arranged on the substrate symmetrically with respect to a central line dividing of right and left part of the substrate. The resistors 12 and 15 are arranged substantially in parallel with each other along the length of the resistors 12 and 15, and an electrical connection line between the resistors 12 and 13 is elbowed at an angle, for example, about 90° at a middle point thereof and an electrical connection line between the resistors 15 and 16 is inversely elbowed at an angle, for example, about 90° at a middle point thereof. The resistors 13 and 16 are arranged along the same line and on more inside than the resistors 12 and 15. An electrical connection line between the resistors 13 and 14 is inversely elbowed at an angle, for example, about 90° and an electrical connection line between the resistors 15 and 16 is elbowed at an angle, for example, about 90°. The resistors 14 and 17 are arranged more inside than the resistors 13 and 16 as being substantially in parallel while extending along the resistors 14 and 17. Thus, there are such relations that the distance between the resistors 12 and 15 is greater than that between the resistors 13 and 16, and the distance between the resistors 12 and 15 is greater than that between the resistors 14 and 17. It is to be noted that the connection lines connecting between high-voltage input terminals INa, INb, resistors 12-17, and measuring terminals Ma, Mb may be formed by a printed circuit.

Figure 3:
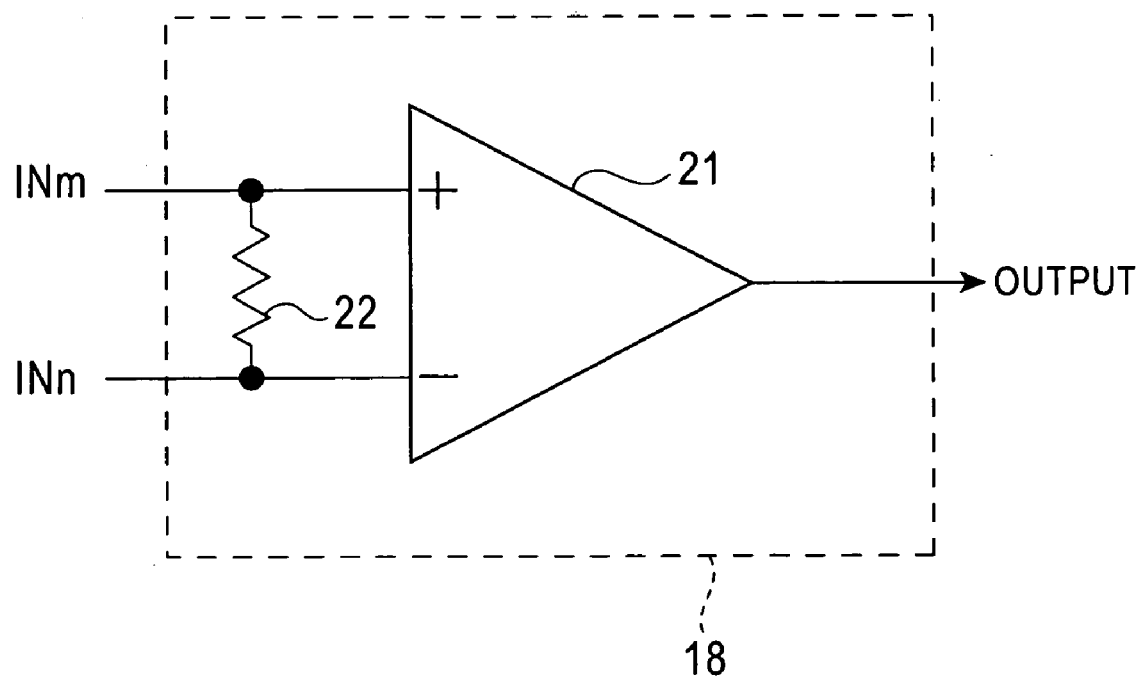
FIG. 3 illustrates an circuit diagram showing a voltage measuring circuit in a high-voltage measuring device according to the present invention.

As shown in FIG. 3, a pair of high-voltage terminals INa and INb on the substrate 11 are electrically connected to positive and negative terminals of a direct-current high-voltage battery 10, respectively. A pair of measuring terminals Ma and Mb on the substrate 11 are also electrically connected to the measuring input terminals INm and INn provided on the voltage measuring circuit, respectively.

The voltage measuring circuit, for example, as shown in FIG. 3, which is provided with a resistor 22 and a voltage comparator 21 of an operational amplifier, produces an output representing an electric potential difference across the resistor 22 which corresponds to the output voltage of the battery 10. It is to be noted that the negative terminal of the battery is electrically connected to the ground potential so that the voltage measuring device 18 detects an electric potential difference across the resistor 22, which is referenced by the ground potential.

When the electric potential difference across the resistor 22 is detected, where the resistance of resistor 22, the output voltage of battery 10, and the detected electric potential difference across the resistor 22 are denoted by D Ω, $V_H$ volt, and $V_D$ volt, respectively, the output voltage $V_H$ at the battery 10 is represented as follows, $$V_H = (2A+2B+2C+D) \cdot V_D / D$$

The high-voltage measuring device according to the present invention is distinguished by three voltage-classes with regard to the applied voltage at the resistors. That is, a first voltage-class corresponds to an area between the resistors 12 and 15, a second voltage-class corresponds to an area between the resistors 12 and 13 and between the resistors 15 and 16, and a third voltage-class corresponds to an area between the resistors 14 and 17. The highest electric potential difference is generated at the area of the first voltage-class so that the resistors 12 and 15 are separated each other by the longest distance. The second highest electric potential difference is generated at area of the second voltage-class so that the resistors 13 and 16 are separated each other by the middle distance. The lowest electric potential difference is generated at the third voltage-class area so that the resistors 14 and 17 are separated each other by the shortest distance. Even though the resistors 14 and 17 at the third voltage-class are arranged around the voltage measuring circuit 18, the electric potential differences between the resistors 14 and 17 and between the resistors 14 and 17 and the voltage measuring circuit 18 are so small that they are sufficiently isolated from each other even by a short distance therebetween.

Figure 1:
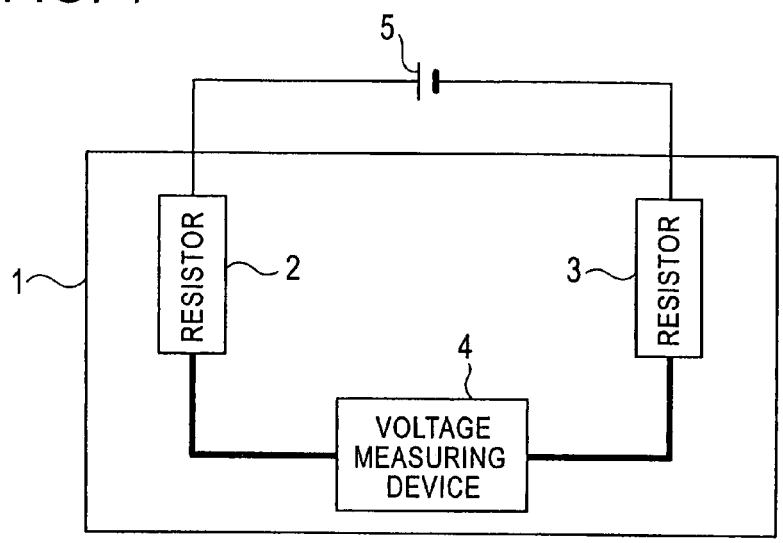
FIG. 1 illustrates a circuit diagram showing a conventional high-voltage measuring device.

By use of the high-voltage measuring device according to the present invention in which the insulation distances for the first, the second, and the third voltage-classes are reduced in sequence, the size of the substrate 11 can be reduced with the resistors 12-17 arranged as shown in FIG. 2 in comparison with the conventional device shown in FIG. 1.

Although the resistive parts according to the present invention are respectively provided with three resistors of large, middle, and small sizes, the resistive parts may be respectively provided with at least one high resistance resistor and at least one low resistance resistor.

The arrangement of the resistors 12-17 is not limited to the above embodiment. The resistors may be disposed in such a manner that the distance between the low resistance resistors is smaller than that between the high resistance resistors.

The pair of high-voltage input terminals INa and INb and the measuring terminals Ma and Mb, and the measuring input terminal of the voltage measuring device INm and Inn are not limited to be only connection terminals but also patterns formed on the substrate or lead wires included in the resistors and circuits.

The above-mentioned configuration according to the present invention in which each of the resistive parts has a series circuit of at least one high resistance resistor and at least one low resistance resistor results in that the size of the high resistance resistors and low resistance resistors is reduced as compared to the conventional device, and that the applied voltage except across the voltage measuring circuit is distributed to the high and low resistance resistors in each of the resistive parts. Since the size of each of the high and low resistance resistors are reduced, the distances between the high resistance resistors, between the low resistance resistors, and between each of the resistors and the voltage measuring device can be shortened in comparison to the conventional device, whereby, the size of the substrate can be reduced.

An embodiment of the high-voltage measuring device, for example, is applicable to such a voltage circuit in power drive unit used for driving motor and is utilized for monitoring a high-voltage generated on each of power modules (U-, V-, and W-phases) in the power drive unit. When the high-voltage measuring device circuit is formed on the power-module control substrate with a high-voltage measuring device of the present invention, the size of the substrate part will be reduced.

What is claim is:

1. A high-voltage measuring device mounted on a substrate, comprising:
   a pair of high-voltage input terminals;
   a pair of measuring terminals;
   a voltage measuring circuit having a pair of input terminals thereof connected to said pair of measuring terminals; and
   two resistive parts, one of which electrically connects between one of said high-voltage input terminals and one of said measuring terminals and the other of which electrically connects between the other of said high-voltage input terminals and the other of said measuring terminals,
   in which each of the resistive parts has a series circuit of at least one high resistance resistor and at least one low resistance resistor,
   wherein a distance between the high resistance resistors is larger than that between the low resistance resistors.

2. A high-voltage measuring device mounted on a substrate according to claim 1,
   wherein said high resistance resistors in said resistive parts are arranged closer to said pair of high-voltage input terminals than said low resistance resistors.

* * * * *